United States Patent [19]

Haferl

[11] Patent Number: 5,115,171
[45] Date of Patent: May 19, 1992

[54] RASTER DISTORTION CORRECTION CIRCUIT

[75] Inventor: Peter E. Haferl, Adliswil, Switzerland

[73] Assignee: RCA Licensing Corporation, Princeton, N.J.

[21] Appl. No.: 722,809

[22] Filed: Jun. 28, 1991

[30] Foreign Application Priority Data

Jan. 4, 1991 [GB] United Kingdom ............... 9100123
Apr. 5, 1991 [GB] United Kingdom ............... 9107215

[51] Int. Cl.$^5$ ............................................. G09G 1/04
[52] U.S. Cl. ................................................. 315/371
[58] Field of Search ........................ 315/370, 371, 408

[56] References Cited

U.S. PATENT DOCUMENTS

| | | | |
|---|---|---|---|
| 4,206,388 | 6/1980 | Ishigaki et al. | 315/371 |
| 4,429,257 | 1/1984 | Haferl | 315/371 |
| 4,634,937 | 1/1987 | Haferl | 315/371 |
| 4,890,043 | 12/1989 | Davie | 315/408 |
| 4,906,902 | 3/1990 | Haferl | 315/371 |

Primary Examiner—Gregory C. Issing
Attorney, Agent, or Firm—Joseph S. Tripoli; Joseph J. Laks; Sammy S. Henig

[57] ABSTRACT

An East-West switching transistor is coupled between a flyback transformer primary winding and a horizontal deflection output transistor circuit to control retrace energy to obtain an East-West modulation of the deflection current amplitude as required for East-West pincushion raster correction. The East-West switching transistor isolates a retrace resonant circuit that includes a horizontal deflection winding from a flyback resonant circuit that includes the flyback transformer during a portion of retrace. The deflection winding is coupled to a common conductor to permit the use of a retrace voltage sample developed in the deflection winding as a feedback signal to synchronize the deflection current to the video signal. The arrangement reduces phase modulation of the deflection current as a function of beam current variations, that could be visible as a beam current dependent horizontal picture shift or a raster bending in a horizontal direction.

26 Claims, 3 Drawing Sheets

RASTER DISTORTION CORRECTION CIRCUIT

The invention relates to a deflection circuit of a video display apparatus.

A horizontal deflection circuit is, typically, required to be accurately phased or synchronized to a video signal containing picture information for obtaining a correct raster display. In common practice, a retrace pulse produced in a flyback transformer of the deflection circuit is employed for providing a feedback pulse in a phase-controlled-loop to achieve such synchronization. However, when an ultor supply is energized by the flyback transformer, beam current variations may modulate a shape and a width of the transformer produced retrace pulse. Disadvantageously, the phase of a horizontal deflection current in a horizontal deflection winding may be offset or phase-shifted relative to that of the flyback transformer produced flyback pulse. The result may be an inaccurate synchronization causing a visible, beam current dependent, horizontal picture shift or a raster bending in a horizontal direction. This undesired effect may be further aggravated when East-West (E-W) distortion raster correction is utilized.

It may be desirable, instead of using the transformer produced retrace pulse, to use a retrace pulse developed in the horizontal deflection winding for the phasing of the deflection circuit to the video signal. To that end, it may be desirable to have an end terminal of the horizontal deflection winding at a common conductor or ground potential, during retrace.

In a horizontal deflection circuit, embodying an aspect of the invention, one end terminal of the horizontal deflection winding is coupled to ground potential. A loose coupling is provided between the flyback transformer and a retrace resonant circuit that includes the deflection winding. The grounded terminal of the deflection winding permits a more accurate phasing of the horizontal deflection winding retrace pulse to the video signal. The loose coupling reduces beam current dependent phase modulation of the horizontal deflection current and also reduces generation of so-called "mouseteeth" type raster distortion. Mouseteeth distortion is described in detail in, for example, U.S. Pat. No. 4,634,937, entitled, EAST-WEST CORRECTION CIRCUIT, in the name of Haferl.

A television deflection apparatus, embodying an inventive feature, includes a source of a first input signal at a frequency that is related to a first deflection frequency. A retrace resonant circuit, includes a deflection winding and a first retrace capacitance. A supply inductance is coupled to a source of input supply voltage for generating a flyback pulse voltage in the supply inductance. A first switching arrangement is responsive to the first input signal and coupled to the retrace resonant circuit and to the supply inductance for generating a deflection current in the deflection winding and a first retrace pulse voltage in the retrace resonant circuit during a retrace interval of a given deflection cycle. A source of a modulation second input signal is provided. A second switching arrangement is responsive to the first and second input signals and coupled to the supply inductance and to the retrace resonant circuit for decoupling the supply inductance from the retrace resonant circuit during a controllable first portion of the first retrace pulse voltage that varies in accordance with the second input signal. The flyback pulse voltage is developed at a first main current conducting terminal of the second switching means and is decoupled by the second switching means from the retrace resonant circuit. The first retrace pulse voltage is developed at a second main current conducting terminal of the second switching means and is decoupled by the second switching means from the supply inductance.

Figure 1:
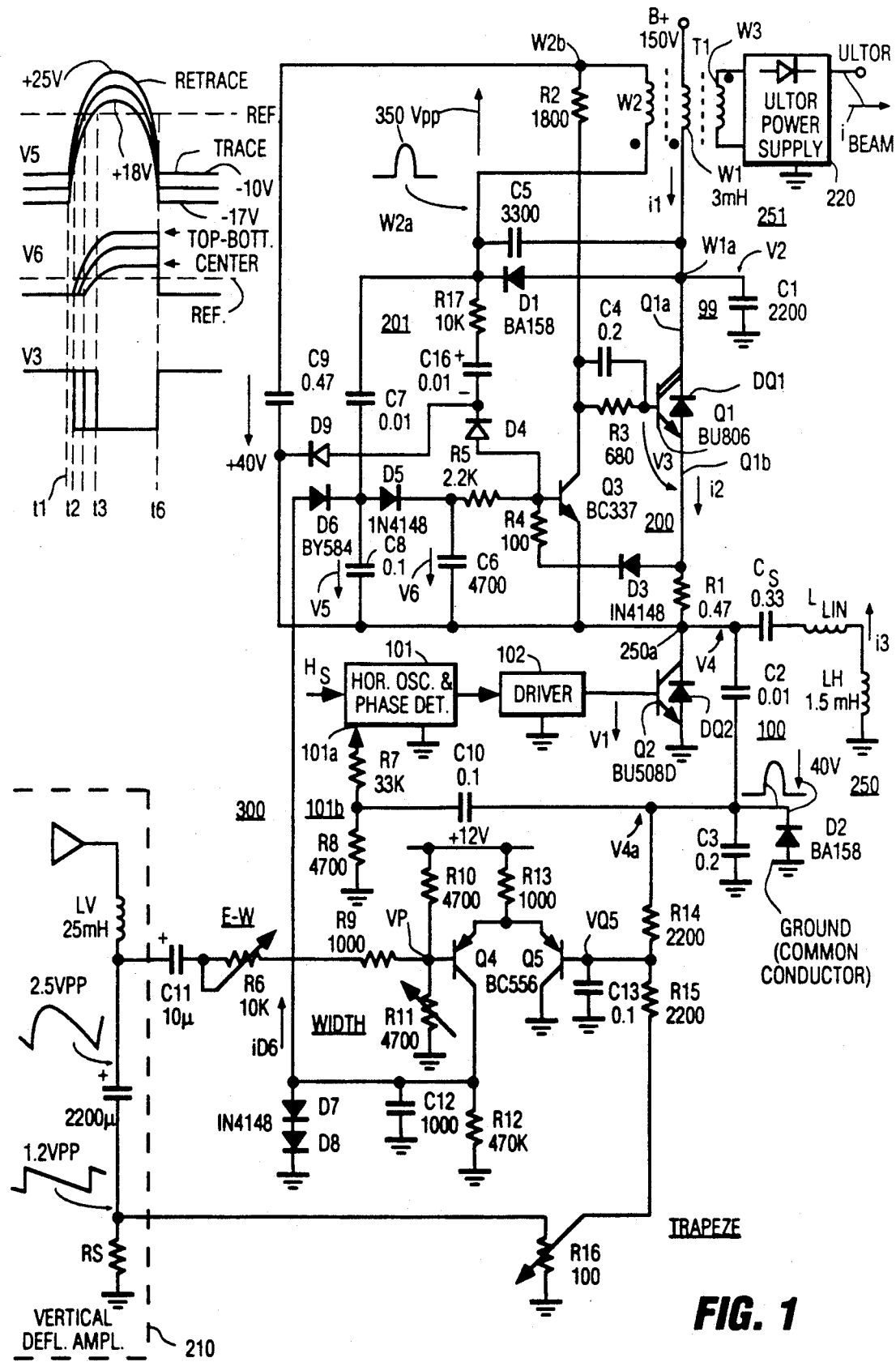
FIG. 1 illustrates a deflection circuit embodying an aspect of the invention that includes an outside pincushion correction arrangement.

A horizontal deflection circuit 250 of FIG. 1, embodying an aspect of the invention, provides horizontal deflection in, for example, an FS color cathode ray tube (CRT) type A66EAS00X01. Circuit 250 includes a switching transistor Q2 operating at a horizontal frequency $f_H$ that is about 15.7 KHz in the NTSC standard and an anti-parallel damper diode DQ2, both being constructed as one integrated circuit. A series arrangement of retrace capacitors C2 and C3 is coupled in parallel with transistor Q2 and diode DQ2. A deflection winding $L_H$ is coupled in series with an S-shaping trace capacitance $C_S$ and with a linearity inductance $L_{LIN}$, forming a circuit branch that is coupled in parallel with each of transistor Q2, diode DQ2 and series coupled retrace capacitors C2 and C3, to form a retrace resonant circuit 100, during horizontal retrace.

A phase control stage 101 that includes a horizontal oscillator and a phase detector, now shown in detail in FIG. 1, is responsive to a horizontal synchronizing signal $H_s$. Signal $H_s$ is derived from, for example, a video detector of a television receiver, not shown in the FIGURES and is referenced to a common conductor or ground potential. Capacitors C2 and C3 form a voltage divider to obtain a sample, low amplitude retrace voltage V4a that is referenced to the common conductor or ground. Voltage V4a is applied via a coupling network 101b to a second input 101a of stage 101 to synchronize retrace pulse voltage V4 to synchronizing signal $H_s$. Stage 101 applies, via a conventional driver stage 102, a switching voltage V1 to the base-emitter junction of transistor Q2 for producing a base drive current at the horizontal frequency $f_H$. Voltage V1 is also referenced to the common conductor or ground potential.

A switched raster distortion correction circuit 200, embodying a feature of the invention, includes an E-W control circuit 300 that controls switching timing of a bipolar, switching transistor Q1 of a flyback circuit 251. A primary winding W1 of a flyback transformer T1 of circuit 251 is coupled between a source of a B+ voltage and a collector of switching transistor Q1. A flyback capacitor C1 is coupled to a junction terminal W1a, between transistor Q1 and winding W1, to form with winding W1 a flyback resonant circuit 99 of circuit 251.

In carrying out an inventive feature, a secondary winding W2 of transformer T1 is coupled at a terminal W2a to a driver stage 201 of transistor Q1 to supply power to stage 201. The emitter of transistor Q1 is coupled via a current limiting resistor R1 to the collector of transistor Q2 of circuit 250. An antiparallel damper diode DQ1 is coupled between the collector and emitter of transistor Q1. A diode D1 having an anode that is coupled between terminal W1a of winding W2 and the collector of transistor Q1 and a cathode that is coupled to terminal W2a, together with winding W2, provides an inrush current path and over-voltage protection for E-W switching transistor Q1.

Resonant circuits 99 and 100 are parallel coupled by transistor Q1, during a controllable portion of the retrace interval to supply energy to deflection circuit 250. Resonant circuits 99 and 100 have the same resonant frequency, 44 KHz. Therefore, resonant circuits 99 and 100 can be coupled in parallel without changing the resulting resonant frequency of circuit 100.

Figure 2:
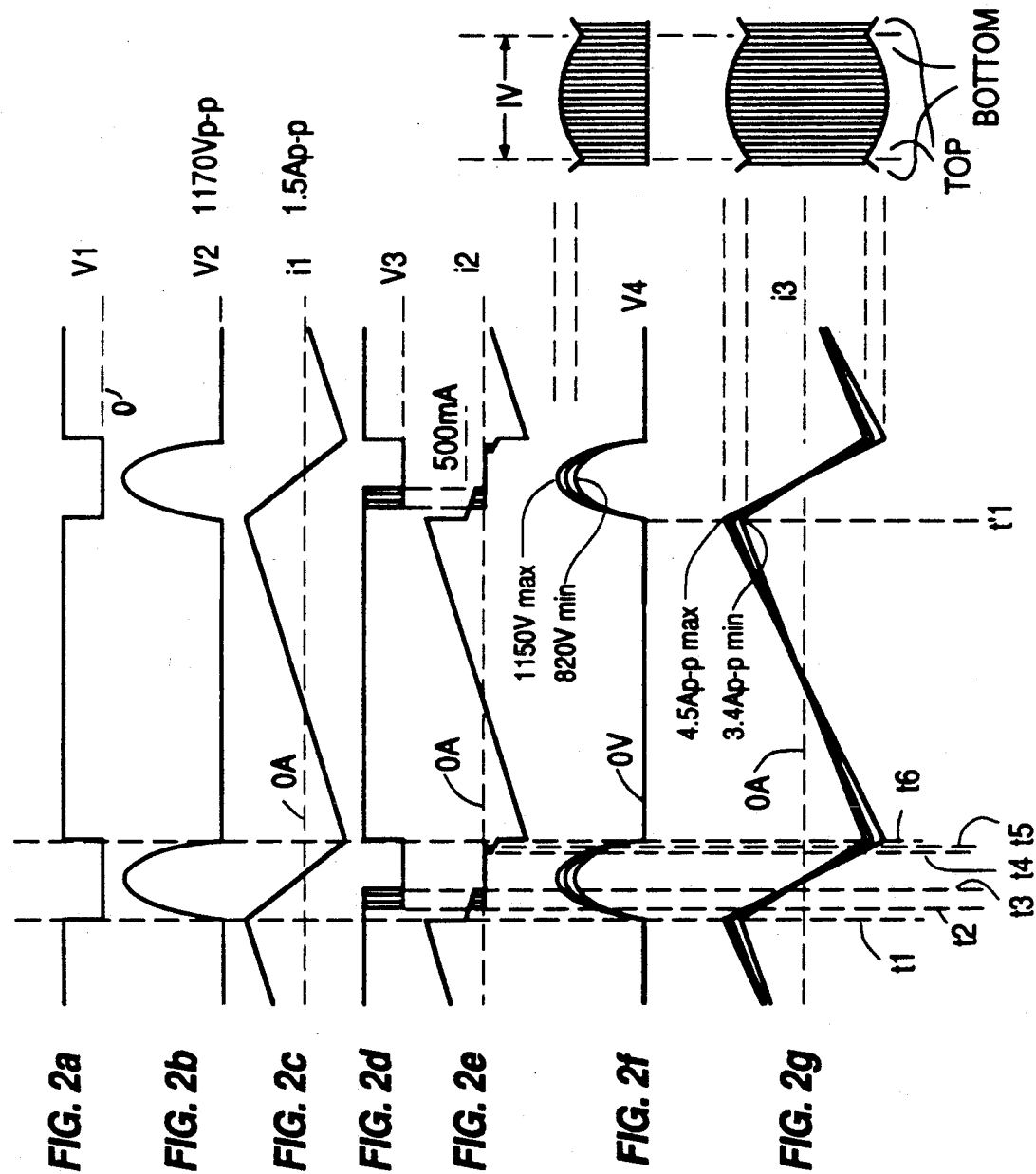
FIGS. 2a–2g illustrate waveforms useful in explaining the operation of the circuit of FIG. 1.

FIGS. 2a-2g illustrate waveforms useful for explaining the operation of the circuit of FIG. 1. Similar symbols and numerals in FIGS. 1 and 2a-2g indicate similar items or functions. Transistors Q1 and Q2 of FIG. 1 are in saturation during a trace interval, t6-t1', as illustrated by waveforms of FIGS. 2a and 2d showing drive voltages V1 and V3, respectively. An upramping trace portion of a current i1 of FIG. 2c flows through series coupled transistors Q1 and Q2 of FIG. 1 to ground. Deflection current i3 of FIG. 2g flows through transistor Q2 of FIG. 1 to ground. Negative portions of currents i1 and i3 flow through the respective integrated diodes DQ1 and DQ2 of transistors Q1 and Q2.

Deflection transistor Q2 is turned off at time t1 of FIG. 2a to initiate a retrace interval t1-t6. Current i3 of FIG. 1 flows then through capacitors C2 and C3 to produce retrace voltage V4, as shown in FIG. 2f. A feedback path formed by a resistor R14 of FIG. 1 couples voltage V4a in capacitor C3 to E-W control circuit 300. A diode D2 coupled across capacitor C3 clamps the trace portion of voltage V4a across capacitor C3 to ground potential. E-W control circuit 300 of FIG. 1 generates a drive voltage V3 at the base of transistor Q1 to turn off transistor Q1 at a controllable instant that occurs during a portion of the retrace interval, interval t2-t3 of FIG. 2d, as explained later on. The amplitude of flyback voltage V2 of FIG. 2b is regulated or stabilized by supply voltage B+ and is independent of variations in the state of conduction of transistor Q1. From time t1 of FIG. 2e until transistor Q1 is turned off, current i2 in transistor Q1 replenishes energy losses in resonant circuit 100.

Flyback current i1 is split into a first portion, current i2, of FIG. 2e, having a small amplitude, flowing through transistor Q1 and capacitors C2 and C3. The remaining portion of current i1 flows through capacitor C1. Current i2 is modulated by the operation of transistor Q1 to obtain amplitude modulation of vertical rate, parabolic shaped envelope of retrace voltage V4 and of deflection current i3, required for correction of E-W raster distortion, as shown in the waveforms of FIGS. 2f and 2g at the right-hand side.

From top toward the center of the raster, the turn-off instant of transistor Q1 of FIG. 1 is increasingly delayed, from time t2 to time t3 of FIG. 2d. This causes an increasing amount of current i2 to flow into deflection circuit 250 to produce increasing amplitudes of retrace voltage V4 and of deflection current i3 of FIGS. 2f and 2g, respectively. From the center to the bottom of the raster, the turn-off instant of transistor Q1 is increasingly advanced from time t3 to t2 of FIG. 2d. As a result, decreasing amounts of current i2 of FIG. 2e flow into deflection circuit 250 of FIG. 1 causing decreasing amplitudes of voltage V4 and current i3. In this way beam positioning or pincushion distortion error is corrected.

During interval t4-t5 of FIG. 2e, negative current i2 flows from deflection circuit 250 to flyback circuit 251. Negative current i2 is proportional to positive current i2. Energy losses in circuit 250 are replenished in accordance with the sum of the positive and negative portions of current i2. The negative portion of current i2 is produced by negative current i1. Negative current i1 supplies retrace energy that circulates into winding W1 and is important for proper operation of deflection circuit 250 and for high, or ultor voltage generation, produced via tertiary winding W3 of transformer T1.

Control circuit 300 includes a driver transistor Q3 responsive to an E-W modulating current iD6 coupled via a diode D6 from a differential amplifier, formed by transistors Q4 and Q5. A trace voltage across winding W2 is rectified via diode DQ1 of transistor Q1 that is coupled in series with diode D1 for producing a supply voltage across a capacitor C9 of about 40 volts, required for the operation of transistors Q3 and Q1 of circuit 300.

During flyback, a flyback voltage across winding W2 is voltage divided by capacitors C7 and C8 to obtain a flyback voltage V5 in capacitor C8 of about 35 volts peak-to-peak. An upramping portion of voltage V5, shown at the left side of FIG. 1, is used for phase modulation of a leading edge of voltage V3, during interval t2-t3, shown in the FIGURE at the left side of FIG. 1. A diode D5 and a resistor R5 couple voltage V5 in capacitor C8 to the base of transistor Q3 for providing a base current drive and determine, in part, by way of peak voltage rectification, a DC, average value of voltage V5.

Assume, for explanation purposes, a situation in which no current flows through diode D6. It follows that diode D5 discharges capacitors C7 and C8 until voltage V5 is smaller than a minimum, threshold voltage, REF, required for turning on transistor Q3, as shown in the waveforms of FIG. 1. As a result, transistor Q3 remains turned off throughout retrace, voltage V3 remains positive that causes transistor Q1 to be conductive throughout retrace.

Increasing charge current iD6 that flows through diode D6, produced in a manner explained later on, level-shifts the entire waveform of voltage V5 closer toward threshold voltage REF. The retrace portion of voltage V5 that exceeds or crosses threshold voltage REF, produces a current that flows through diode D5 and resistor R5. The result is that transistor Q3 is switched into saturation and produces the leading edge of voltage V3 that turns off transistor Q1 at an instant that is controlled by the magnitude of current iD6.

A capacitor C6 has a first terminal that is coupled between diode D5 and resistor R5 and a second terminal that is coupled to a collector terminal 250a of transistor Q2. During retrace, capacitor C6 charges approximately to the peak voltage of voltage V5 to supply a base drive current in transistor Q3 that keeps transistor Q3 saturated, until the end of retrace, as shown in the waveform of voltage V6 of FIG. 1. At the end of retrace, capacitor C6 discharges via a series arrangement of resistor R5, a diode D4, a capacitor C16, a resistor R17 and winding W2, at time t6 that produces the trailing edge of voltage V3 to turn-off transistor Q3.

During retrace, capacitor C16 is charged to a negative voltage via a diode D9 and a resistor R17. During trace, it is discharged via a diode D3, a resistor R4, a diode D4 and resistor R17 for reverse biasing the base-emitter of transistor Q3. Base current of transistor Q1 is supplied via series coupled resistors R2 and R3 to keep transistor Q1 in saturation during the trace interval. Thus, the turn-off instant of transistor Q1 is modulated by the amount of charge current iD6 flowing through diode D6. A higher charge current iD6 level-shifts voltage V5 in a positive direction and causes transistor Q1 to turn-off at earlier time t2. A smaller charge current iD6 increasingly delays the turn-off instant, toward later time t3.

The differential amplifier that includes transistors Q4 and Q5 generates current iD6 to charge capacitor C8. In the amplifier, a vertical rate parabolic, E-W drive voltage VP is applied to the base of transistor Q4, produced by a vertical deflection circuit 210 in a conventional manner. A feedback portion of voltage VQ5, developed in an integrating capacitor C13 at the base of transistor Q5, is coupled via a resistor R14 and an integrating capacitor 13 from voltage V4a in capacitor C3 and is indicative of a magnitude of deflection current i3. A second portion of voltage VQ5 is developed via a resistor R15 from circuit 210 to provide trapeze correction. Charge current iD6 that varies in a vertical rate is supplied via the collector of transistor Q4 and via diode D6, only during the trace interval, when transistor Q2 is saturated and voltage V4 is zero.

Diodes D7 and D8, coupled in series, limit the voltage across a capacitor C12 coupled in parallel with a collector load resistor R12 of transistor Q4. Therefore, diodes D7 and D8 also limit voltage V5 across capacitor C8 to prevent transistor Q3 from being turned on prior to time t1, when the leading portion of voltage V2 occurs. Diode D6 is nonconductive, during retrace, to isolate the low voltage differential amplifier, formed by transistors Q4 and Q5 from retrace pulse V4 on which voltage V5 is superimposed. Thus, capacitor C8 is charged during trace for establishing the turn-off instant of transistor Q1, during retrace.

Transistors Q1 and Q2 are protected against excessive currents by resistor R1, and by a series arrangement of diode D3 and resistor R4, that is coupled between the base of transistor Q3 and a junction terminal, between resistor R1 and transistor Q1. When a voltage across current sampling resistor R1 that is coupled in series with transistors Q1 and Q2 exceeds the sum of the forward voltages of diode D3 and of the base-emitter junction of transistor Q3, transistor Q3 turns on and reduces the current flow in transistors Q1 and Q2. Deflection linearity is, advantageously, not degraded by resistor R1 because resistor R1 is outside deflection circuit 250.

Transistor Q1 operates in a common base mode during current inrush. When the B+ voltage is initially applied to the circuit, transistor Q3 is in cut off. Consequently, the base of transistor Q1 is coupled to the B+ voltage via resistors R3 and R2, winding W2, diode D1 and winding W1. When transistor Q2 starts the switching operation, transistor Q1 conducts in common base mode until a rectified trace voltage, developed across a capacitor C9, supplies sufficient base current via resistors R2 and R3 to keep transistor Q1 in saturation.

The circuit that includes diode D1, winding W2 and capacitor C9 is coupled between the collector and emitter of transistor Q1. When a flyback voltage across transistor Q1 exceeds a sum of the voltages across capacitor C9 and across winding W2, that is 350 volts, flyback current flows through diode D1, winding W2 and capacitor C9 into deflection circuit 250. This causes an increase of voltage V4 and subsequently a limitation of the collector-emitter voltage of transistor Q1 to 350 volts. Thus the E-W control range is limited by such over-voltage protection circuit. Advantageously, the over-voltage protection for transistor Q1 allows the use of a transistor with a lower voltage rating than transistor Q2.

The total flyback capacitance of flyback transformer T1 includes capacitor C1 and capacitor C7. A capacitor C5 coupled between the dotted terminals of windings W1 and W2, terminal W1a, does not contribute to the flyback time because the flyback voltage across capacitor C5 is low. It has been found, however, that capacitor C5, advantageously, reduces an output impedance of an ultor voltage supply 220, energized by winding W3, at a high beam current $i_{BEAM}$.

Figure 3:
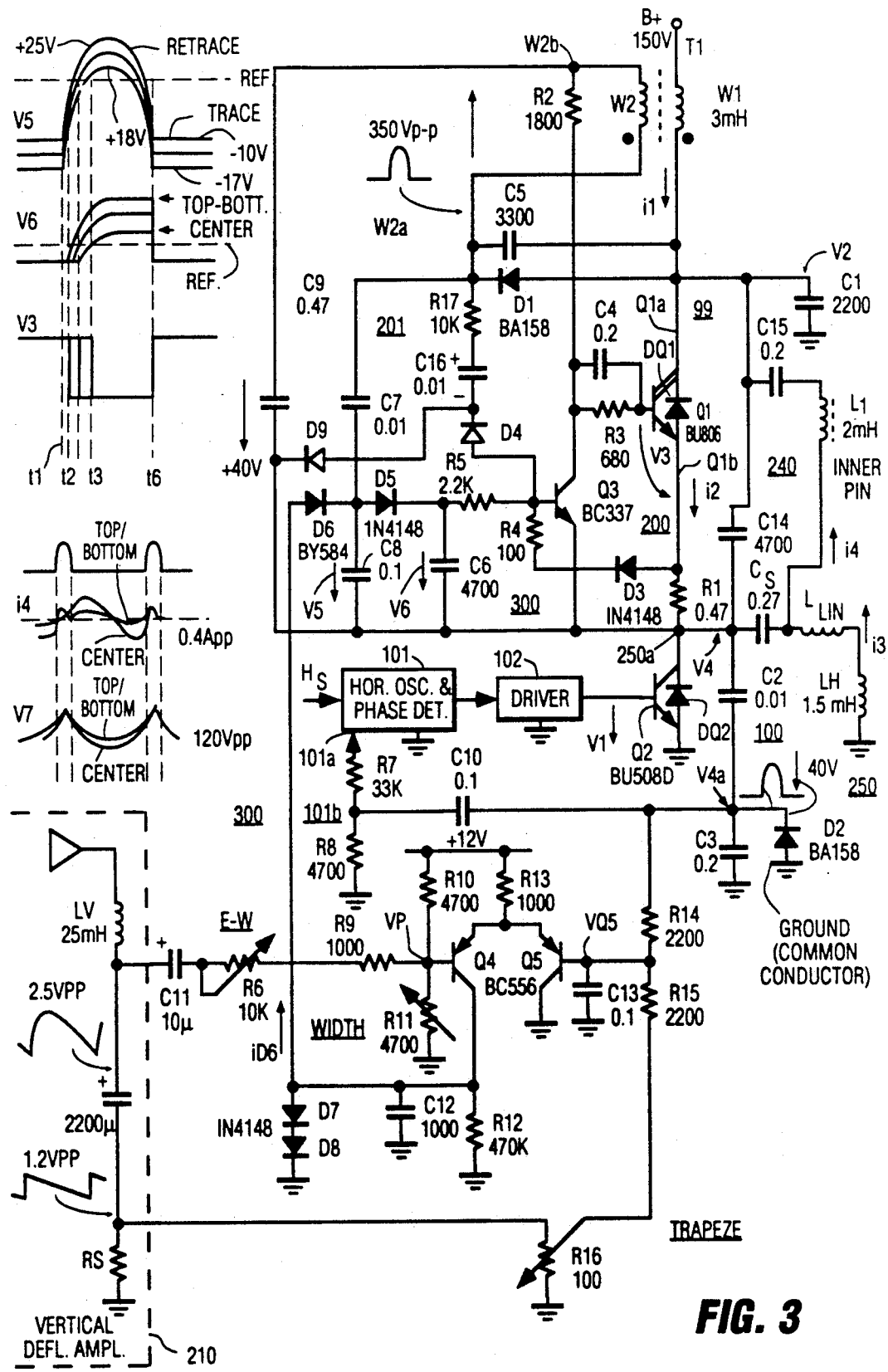
FIG. 3 illustrates a deflection circuit embodying another aspect of the invention that includes outside and inside pincushion correction arrangement.

FIG. 3 illustrates a deflection circuit embodying another aspect of the invention that is similar to that in FIG. 1, with the differences noted below. Similar symbols and numerals in FIGS. 1, 2a–2g and 3 indicate similar items or functions.

The arrangement of FIG. 3 provides horizontal deflection in a CRT, Philips 45AX type A66EAK00X01, which requires both outside and inside pincushion correction. An inside pincushion correction circuit 240 includes a coil L1 that may be variable for adjustment purposes, a capacitor C15 and a retrace capacitor C14. Series coupled coil L1 and capacitor C15 form an arrangement that is parallel coupled to capacitor $C_S$, during the trace interval via transistor Q1. Coil L1, capacitor $C_S$ and capacitor C15 form a trace resonant circuit that is tuned to, for example, 12–14 KHz, that is higher than the trace resonance frequency, of about 6 KHz of winding $L_H$ and capacitor $C_S$. Thus, a current i4 in coil L1 has a higher degree of "S" shaping than deflection current i3, as shown in the waveform of current i4 in FIG. 3. Current i4 is generated by a voltage V7 developed across capacitor $C_S$. Current i4 is modulated by the retrace voltage across transistor Q1. This retrace voltage is the difference between voltages V2 and V4 and, therefore, is amplitude modulated by the outside pincushion circuit of FIG. 1. Retrace voltage V4 of FIG. 3 is of opposite phase to voltage V7, resulting in a modulation of current i4 and of voltage V7. Thus, a low flyback voltage across transistor Q1 produces an increased amplitude of each of current i4 and voltage V7 and, in turn, more "S"-shaping of deflection current i3. Similarly, less "S"-shaping is obtained at a higher amplitude of the retrace voltage across transistor Q1. Retrace capacitor C14 provides a current path for current i4 during retrace to prevent increased coupling between flyback transformer T1 and deflection circuit 250.

The circuits of FIGS. 1 and 3 may be modified for operation at a horizontal deflection frequency $2 \times f_H$. In this case, an MOS transistor, instead of a bipolar transistor, may be utilized as transistor Q1. Advantageously, mooseteeth distortions are reduced in the circuits of FIGS. 1 and 3. This is so because by decoupling circuits 250 and 251 of, for example, FIG. 1, during a significant portion of retrace, transistor Q1 reduces beam current dependent energy transfer from deflection circuit 250 back to deflection circuit 251.

In accordance with another inventive feature, transistor Q1 is coupled between resonant circuits 99 and 100 such that the collector of transistor Q1 is coupled to resonant circuit 99 via a current path section Q1a that excludes the emitter of transistor Q1; whereas the emitter of transistor Q1 is coupled to resonant circuit 100 via a current path section Q1b that excludes the collector of transistor Q1 and the common conductor. The result is that when, during retrace, transistor Q1 is nonconductive, resonant circuits 99 are decoupled from each other by transistor Q1. Therefore, advantageously, when transistor Q1 is nonconductive, resonant circuit 99 does not cause a distortion in the waveform of pulse voltage V4a in capacitor C3.

The waveform of voltage V4a in capacitor C3 is coupled to input terminal 101a of stage 101 via network 101b in a manner that bypasses transformer T1. Both capacitor C3 and stage 101 are referenced to the common conductor. Thus, by decoupling circuits 250 and 251, the waveform at terminal 101a is not distorted by beam current loading in transformer T1 and E-W modulation and, hence, more accurately represents the timings of deflection current i3 to provide more accurate phasing or synchronization in stage 101.

What is claimed is:

1. A television deflection apparatus, comprising:
   a source of a first input signal at a frequency that is related to a first deflection frequency;
   a retrace resonant circuit, including a deflection winding and a first retrace capacitance;
   a source of an input supply voltage;
   a supply inductance coupled to said source of input supply voltage for developing at least a portion of a flyback pulse voltage in said supply inductance;
   first switching means responsive to said first input signal and coupled to said retrace resonant circuit and to said supply inductance for generating a deflection current in said deflection winding and for developing at least a portion of a first retrace pulse voltage in said retrace resonant circuit during a retrace interval of a given deflection cycle;
   a source of a modulation second input signal; and
   second switching means responsive to said first and second input signals and coupled to said supply inductance and to said retrace resonant circuit for decoupling said supply inductance from said retrace resonant circuit and to develop said flyback pulse voltage at a first main current conducting terminal of said second switching means and said first retrace pulse voltage at a second main current conducting terminal of said second switching means, during a controllable first portion of said first retrace pulse voltage that occurs when said supply inductance and said retrace resonant circuit are decoupled, the controllable first portion of said first retrace pulse voltage varying in accordance with said second input signal.

2. An apparatus according to claim 1 wherein said first main current conducting terminal of said second switching means is coupled to said supply inductance at a point remote from said retrace resonant circuit, and said second main current conducting terminal of said second switching means is coupled to said retrace resonant circuit at a point remote from said supply inductance.

3. An apparatus according to claim 1 wherein said second switching means forms, during said first portion, a high impedance that is interposed between said supply inductance and said retrace resonant circuit.

4. An apparatus according to claim 1 further comprising, a flyback capacitance coupled to said supply inductance to form a flyback resonant circuit that is coupled via said second switching means to said deflection winding during a second portion of said first retrace pulse voltage.

5. An apparatus according to claim 4 wherein said resonant circuits have, each, substantially equal resonance frequencies.

6. An apparatus according to claim 4 wherein a resonance frequency of a combined resonant circuit that includes said supply inductance, said deflection winding said first retrace capacitance and said flyback capacitance is substantially the same as that of said retrace resonant circuit, alone.

7. An apparatus according to claim 1 wherein said supply inductance comprises a primary winding of a flyback transformer having a second winding that is coupled to an ultor voltage power supply that is energized by a high voltage developed in said second winding of said transformer, said ultor voltage power supply forming a load that varies in accordance with a beam current variation.

8. An apparatus according to claim 1 wherein said second switching means operates in a conductive state during a second portion of said first retrace pulse voltage and in a nonconductive state during said first portion of said first retrace pulse voltage.

9. An apparatus according to claim 8 wherein said second portion precedes said first portion during a given retrace interval.

10. An apparatus according to claim 8 wherein a retrace resonance frequency of said retrace resonant circuit is maintained substantially the same when said second switching means is conductive and when said second switching means is nonconductive.

11. An apparatus according to claim 1 wherein said supply inductance comprises a winding of a flyback transformer that is decoupled from said retrace resonant circuit by said second switching means when said second switching means is nonconductive and that is coupled through said second switching means to said retrace resonant circuit when said second switching means is conductive.

12. An apparatus according to claim 1 further comprising, a phase-control-stage responsive to said first input signal and to a feedback retrace pulse voltage that is coupled from said retrace resonant circuit in a manner that bypasses said supply inductance.

13. An apparatus according to claim 1 wherein said second switching means is coupled in series with said first switching means during a trace portion of said given deflection cycle.

14. An apparatus according to claim 1 further comprising, a trace capacitance that is coupled to said deflection winding to form a first trace resonant circuit during a trace interval of said deflection cycle and a second trace resonant circuit that is coupled to said trace capacitance to provide an inside pincushion distortion correction.

15. An apparatus according to claim 1 wherein each of said first and second switching means operates at a horizontal rate and wherein said second switching means becomes nonconductive, within said retrace interval, at an instant that varies at a vertical rate parabolic manner that provides pincushion distortion correction.

16. An apparatus according to claim 1 further comprising, means responsive to a signal at a vertical rate for producing a control signal at a control terminal of said second switching means such that a phase of said control signal varies in accordance with said vertical rate signal.

17. An apparatus according to claim 1 further comprising, a second retrace capacitance that is coupled in series with said first retrace capacitance to develop in said second retrace capacitance a second retrace pulse voltage and a phase-control stage having an input coupled between said retrace capacitances in a manner that bypasses said supply inductance.

18. An apparatus according to claim 1 further comprising, a control circuit that is referenced to a junction terminal between said first and second switching means for generating a control signal at a control terminal of said second switching means wherein, during a trace interval of said deflection cycle, said junction terminal is at a constant potential and wherein, during said retrace interval, a retrace voltage is developed at said junction terminal.

19. An apparatus according to claim 1 further comprising, a load circuit coupled to said supply inductance and energized by said flyback pulse voltage wherein said second switching means forms a high impedance that reduces mouseteeth distortions by reducing energy transfer from said retrace resonant circuit to said load circuit, during said retrace interval.

20. An apparatus according to claim 1 further comprising, means responsive to said first input signal and to said first retrace pulse voltage for generating a control signal that is coupled to a control terminal of said first switching means to form a phase-control-loop, wherein said second switching means decouples said flyback pulse voltage from said control signal generating means.

21. An apparatus according to claim 20 wherein said first retrace pulse voltage is referenced to a reference potential of said control signal generating means.

22. An apparatus according to claim 1 wherein said first and second switching means are coupled in series, during a portion of a trace interval of said deflection cycle and wherein said supply inductance, said second switching means and said retrace resonant circuit are coupled in series during a second portion of said first retrace pulse voltage.

23. An apparatus according to claim 1 wherein said second switching means decouples said first retrace pulse voltage from said supply inductance and said flyback pulse voltage from said retrace resonant circuit, during said controllable first portion of said retrace pulse voltage.

24. A deflection apparatus with beam positioning error correction, comprising:
a source of a first input signal at a frequency that is related to a horizontal deflection frequency;
a retrace resonant circuit including a deflection winding and a retrace capacitance;
a first transistor switch responsive to said first input signal and coupled to said retrace resonant circuit for generating a horizontal deflection current in said deflection winding and a retrace pulse voltage in said retrace resonant circuit;
a flyback resonant circuit including a supply inductance for generating a flyback pulse voltage in said supply inductance;
a source of a second input signal at a frequency that is related to a vertical deflection frequency;
means responsive to said first and second input signals for generating a control signal at a horizontal frequency that varies in accordance with said vertical deflection frequency; and
a second transistor switch, coupled in series with said first transistor switch during a trace interval of a given cycle of said horizontal deflection current, said second transistor switch coupling said resonant circuits during a first period of said deflection cycle and decoupling said resonant circuits during a portion of a retrace interval of said deflection cycle, the retrace interval portion varying in accordance with said control signal, such that during said retrace interval portion, said flyback pulse voltage is developed at a first main current conducting terminal of said second transistor switch and said retrace pulse voltage is developed at a second main current conducting terminal of said second transistor switch.

25. An apparatus according to claim 24 further comprising, a protection circuit responsive to a voltage that is developed across said second transistor switch for generating a current that causes an increase in an amplitude of said retrace pulse voltage when an over-voltage condition occurs in a manner to protect said second transistor switch against said over-voltage condition.

26. A television deflection apparatus, comprising:
a source of a first input signal at a frequency that is related to a first deflection frequency;
a retrace resonant circuit, including a deflection winding and a first retrace capacitance;
a source of an input supply voltage;
a supply inductance coupled to said source of input supply voltage;
first switching means responsive to said first input signal and coupled to said retrace resonant circuit and to said supply inductance for generating a deflection current in said deflection winding, a first retrace pulse voltage in said first retrace capacitance and a flyback pulse voltage in said supply inductance during a retrace interval of a given deflection cycle;
a source of a modulation second input signal; and
second switching means responsive to said first and second input signals and having a first main current conducting terminal that is coupled to said supply inductance via a current path section that excludes a common conductor and a second main current conducting terminal of said second switching means, said second main current conducting terminal being coupled to said retrace resonant circuit via another current path section that excludes said common conductor and said first main current conducting terminal, the two current path sections and said second switching means coupling said supply inductance to said retrace resonant circuit during a first period of said first retrace pulse voltage, the first period of said first retrace pulse voltage varying in accordance with said second input signal, said second switching means decoupling said retrace resonant circuit from said supply inductance during a second period of said first retrace pulse voltage.

* * * * *